United States Patent
Yang et al.

(10) Patent No.: US 7,687,923 B2
(45) Date of Patent: Mar. 30, 2010

(54) SEMICONDUCTOR DEVICE PACKAGE HAVING A BACK SIDE PROTECTIVE SCHEME

(75) Inventors: Wen-Kun Yang, Hsin-Chu (TW); Hsien-Wen Hsu, Lujhou (TW)

(73) Assignee: Advanced Chip Engineering Technology Inc., Hsinchu County (TW)

( * ) Notice: Subject to any disclaimer, the term of this patent is extended or adjusted under 35 U.S.C. 154(b) by 14 days.

(21) Appl. No.: 11/933,758

(22) Filed: Nov. 1, 2007

(65) Prior Publication Data

US 2009/0039497 A1 Feb. 12, 2009

Related U.S. Application Data

(63) Continuation-in-part of application No. 11/835,555, filed on Aug. 8, 2007, now abandoned.

(51) Int. Cl.
H01L 23/29 (2006.01)
(52) U.S. Cl. .................. 257/783; 257/E23.193
(58) Field of Classification Search ............. 257/693, 257/734, 684, 747, 700, 783, 777, E23.193
See application file for complete search history.

(56) References Cited

U.S. PATENT DOCUMENTS

| | | | |
|---|---|---|---|
| 6,023,094 A | 2/2000 | Kao et al. | 257/632 |
| 6,175,162 B1 | 1/2001 | Kao et al. | 257/787 |
| 6,384,474 B1* | 5/2002 | Topp | 257/684 |
| 6,770,971 B2* | 8/2004 | Kouno et al. | 257/734 |
| 7,049,695 B1* | 5/2006 | Pogge | 257/700 |
| 7,397,111 B2* | 7/2008 | Jerebic et al. | 257/659 |
| 7,429,793 B2* | 9/2008 | Yamagata | 257/723 |
| 2002/0173077 A1* | 11/2002 | Ho et al. | 438/113 |
| 2004/0169266 A1* | 9/2004 | Maxwell | 257/684 |
| 2005/0048759 A1* | 3/2005 | Hsu | 438/618 |
| 2005/0127502 A1* | 6/2005 | Lee et al. | 257/720 |
| 2006/0214295 A1* | 9/2006 | Tanaka et al. | 257/747 |
| 2007/0161234 A1* | 7/2007 | Rinne et al. | 438/659 |
| 2007/0246823 A1* | 10/2007 | Haga et al. | 257/712 |
| 2008/0157396 A1* | 7/2008 | Yang | 257/778 |

* cited by examiner

Primary Examiner—Nathan W Ha
(74) Attorney, Agent, or Firm—Kusner & Jaffe

(57) ABSTRACT

The present invention provides a semiconductor device package, comprising a die having a back surface and an active surface formed thereon; an adhesive layer formed on the back surface of the die; a protection substrate formed on the adhesive layer; and a plurality of bumps formed on the active surface of the die for electrically connection. The present invention further provides a method for forming a semiconductor device package, comprising providing a plurality of die having a back surface and an active surface on a wafer; forming an adhesive layer on the back surface of the die; forming a protection substrates on the adhesive layer; forming a plurality of bumps on the active surface of each die; and dicing the plurality of die into individual die for singulation.

10 Claims, 1 Drawing Sheet

SEMICONDUCTOR DEVICE PACKAGE HAVING A BACK SIDE PROTECTIVE SCHEME

RELATED APPLICATIONS

The present application is a continuation-in-part (CIP) application of a U.S. application Ser. No. 11/835,555, entitled "Semiconductor Device Package Having a Back Side Protective Scheme", and filed on Aug. 8, 2007 now abandoned, which is incorporated herein by reference in its entirety.

FIELD OF THE INVENTION

This invention relates to a structure of semiconductor device package, and more particularly to a structure of semiconductor device package having a back side protective scheme, thereby protecting the package body and improving the reliability.

BACKGROUND OF THE INVENTION

Description of the Prior Art

In recent years, the high-technology electronics manufacturing industries launch more feature-packed and humanized electronic products. Rapid development of semiconductor technology has led to rapid progress of a reduction in size of semiconductor packages, the adoption of multi-pin, the adoption of fine pitch, the minimization of electronic components and the like.

Because conventional package technologies have to divide a dice on a wafer into respective dice and then package the die respectively, therefore, these techniques are time consuming for manufacturing process. Since the chip package technique is highly influenced by the development of integrated circuits, therefore, as the size of electronics has become demanding, so does the package technique. For the reasons mentioned above, the trend of package technique is toward ball grid array (BGA), flip chip ball grid array (FC-BGA), chip scale package (CSP), Wafer level package (WLP) today. "Wafer level package" is to be understood as meaning that the entire packaging and all the interconnections on the wafer as well as other processing steps are carried out before the singulation (dicing) into chips (dice). By wafer level packaging technology, we can produce die with extremely small dimensions and good electrical properties. Though the advantages of WLP technique mentioned above, some issues still exist influencing the acceptance of WLP technique. Traditionally, due to the package structure having multiple-chips is required, the sizes of the package structure increases with the numbers or total heights of multiple dice, so that the processes is more complex.

FIG. 1 illustrates the cross-section diagram of the conventional package with bottom surface protective coating disclosed by the U.S. Pat. Nos. 6,023,094 and 6,175,162. The package structure 200 comprises a die 102 having a bottom surface 104 and a top surface 108. The package structure 200 further comprises a protective film 210 formed on the bottom surface 104 of the die 102 to cover the bottom surface 104, and a plurality of bumps 106 formed on the top surface 104 of the die 102. Further, the size of the protective film 210 is as same as the size of the chip 102. The protective film 210 has low thermal conductivity around 0.2, and the thickness is approximately 1.5-5 mils. Accordingly, the size of the package structure 200 is accumulated and equivalent to the total sizes of each material layer, and the differences of the thermal conductivity among each material layer are remarkable for poor adhesion among the material layers.

Further, the material of the protective film 210 usually includes the epoxy or rubber materials. When the epoxy material is employed for the protective film 210, in order to offer proper protection, the epoxy must be thick than others due to the material property. However, the protective film 210 will be too thick to warp during the manufacture process and it is very easily cracked during dicing saw or outside force. If the rubber material is employed for the protective film 210, the hardness of the protective film 210 is usually insufficient to protect the package structure. However, the processes for manufacturing the package structure also become more and more complex and costly. In conclusion, the thickness or hardness of the protective film 210 is serious concern and it is insufficient to protect the package structure at present.

In view of the aforementioned, what is required is a brand new scheme to overcome the above drawback.

SUMMARY OF THE INVENTION

The present invention will descript some preferred embodiments. However, it is appreciated that the present invention can extensively perform in other embodiments except for these detailed descriptions. The scope of the present invention is not limited to these embodiments and should be accorded the following claims.

One objective of the present invention is to provide a structure of semiconductor device package having a back side protective scheme, which can protect the package structure from the external force.

Another objective of the present invention is to provide a structure of semiconductor device package having a back side protective scheme, which solves the crack and warp issues during process.

Still another objective of the present invention is to provide a structure of semiconductor device package having a back side protective scheme, which can lower the costs and improve the reliability.

Yet another objective of the present invention is to provide a structure of semiconductor device package having a back side protective scheme, which can easily perform the laser marking on the top surface of the semiconductor device package.

The present invention provides a structure of semiconductor device package, comprising a die having a back surface and an active surface formed thereon; an adhesive layer formed on the back surface of the die; a protection substrate formed on the adhesive layer; and a plurality of bumps formed on the active surface of the die for electrically connection.

The present invention provides a method for forming a structure of semiconductor device package, comprising providing a plurality of die having a back surface and an active surface on a wafer; forming an adhesive layer on the back surface of the die; forming a protection substrates on the adhesive layer; forming a plurality of bumps on the active surface of each die; and dicing the plurality of die into individual die for singulation.

BRIEF DESCRIPTION OF THE DRAWINGS

The foregoing aspects and many of the attendant advantages of this invention will become more readily appreciated as the same becomes better understood by reference to the following detailed description, taken in conjunction with the accompanying drawings, wherein.

DESCRIPTION OF THE PREFERRED EMBODIMENT

In the following description, numerous specific details are provided in order to give a through understanding of embodiments of the invention. Referring now to the following description wherein the description is for the purpose of illustrating the preferred embodiments of the present invention only, and not for the purpose of limiting the same. One skilled in the relevant art will recognize, however, that the invention may be practiced without one or more of the specific details, or with other methods, components, materials, etc.

Figure 1:
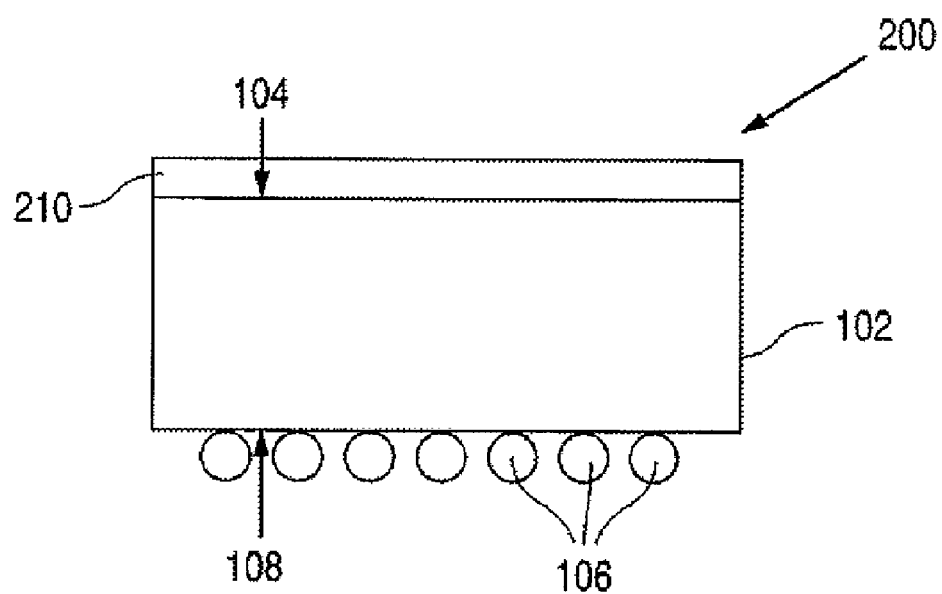
FIG. 1 illustrates a cross-section diagram of a structure of semiconductor device package according to the prior art.
Figure 2:
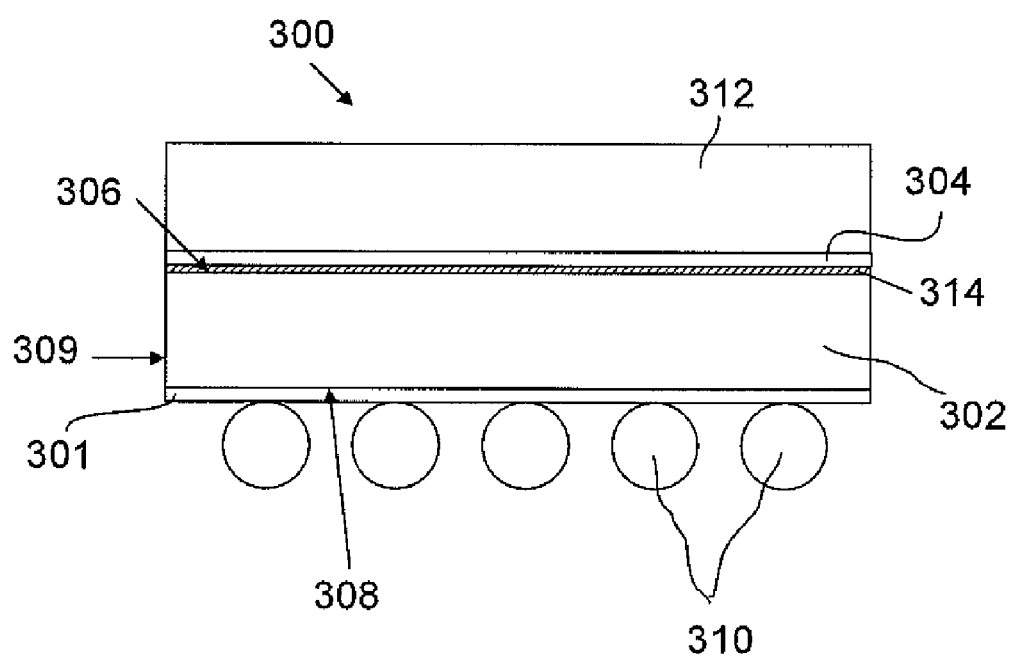
FIG. 2 illustrates a cross-section diagram of a structure of semiconductor device package according to the present invention.

FIG. 2 illustrates a cross-section diagram of a structure of semiconductor device package 300 according to the present invention. The package 300 comprises at least one die 302 having a back surface 306 and an active surface 308. It should be noted that the active surface 308 may includes contact pads 310 and a redistribution layer (RDL) 301 formed over the die 302. A plurality of contact pads or bumps 310 are formed on the active surface 308 of the die 302 for electrically connection. Namely, the adhesive layer 304 is formed on the back surface of the die 302. The protection substrate 312 is then formed on the adhesive layer 304. In one embodiment, the top surface of the protection substrate is employed as a laser or ink marking area.

In one embodiment, the material of the adhesive layer 304 includes elastic type material having elastic property to absorb the external force and/or acting the buffer layer. The material of the protection substrate 312 includes the build in fiber glass having rigid property to protect the package structure. The material of the protection substrate 312 preferably includes BT, FR5, PI (polyimide) or FR4. Please be noted that the build in fiber glass may enhance the strength of the protection substrate 312 but with thinner thickness, thereby scaling down the thickness of whole package.

In one embodiment, the thickness of the protection substrate 312 is approximately 25-200 μm. Preferably, the thickness of the protection substrate 312 can be 25, 50, 75, 100 or 200 μm. In the application, the thickness of the protection substrate 312 is substantially as near as the thickness of the die 302. The coefficient of thermal expansion (CTE) of the protection substrate 312 is about 14-17, and is preferably matching with the CTE of the printed circuit board (PCB) during the process.

Under the above structure, the package 300 comprises a protection substrate 312 with the build in fiber glass formed on the adhesive layer 304 to cover and protect the die 302 due to the substrate has the rigid character. The external force caused between the protection substrate 312 and the die 302 can be absorbed and buffered by the adhesive layer 304 due to the elastic property. It may absorb the external force promptly. Especially, the external forces at the lateral sides 309 can be reduced in the thinner package structure, such as the package size is 50-200 μm (thickness), and preferably, the size (thickness) is about 100-300 μm for the Wafer Level-Chip Scale Package (WL-CSP) process.

According to another aspect of the invention, the present invention further provides a method for forming a semiconductor device package.

First, a plurality of die 302 is provided on a wafer, and each die 302 has a back side surface 306 and an active surface 308.

The adhesive layer 304 is formed on the back surface 306 of the die 302. The protection substrate 312 is formed on the adhesive layer 304. The adhesion layer 304 is pre-coated with the protection substrate 312 together before bonding (lamination).

Sequentially, a plurality of bumps 310 are formed on the active surface 308 of the die 302, and the bumps 310 are employed for electrical connection. The plurality of die 302 is diced into individual die for singulation.

In one embodiment, the protection substrate 312 is formed by performing a panel bonding (lamination) method.

The scribe line (not shown) is disposed between each die 302, and the plurality of die 302 is separated into individual die for singulation along the scribe line. In one embodiment, a conventional sawing blade is used during the singulation process. The blade is aligned to the scribe line to separate the dice into individual die during the singulation process. And the size (X/Y) of the protection substrate will be same as the size (X/Y) of die after singulation.

The back side structure acts as a protection scheme in the present invention, it can prevent the package from being crack or warp, thereby protecting the package structure to increase the packaging yield and quality.

Optionally, a seed metal film (or layer) 314 can be sputtered or plated on the back side of the die 302 for better thermal management inquiry.

In the specification, it is appreciated that the certain descriptions regarding the similar elements are omitted to avoid obscuring the present invention. It is noted that the material and the arrangement of the structure are illustrated to describe but not to limit the present invention. The material and the arrangement of the structure can be modified according to the requirements of different conductions.

According to the aspect of the present invention, the present invention provides a structure of semiconductor device having a back side protection scheme that can protect the package structure during process to lower the costs and improve the reliability. The present invention also provides a new structure and method having no crack or warp issue after forming the protection substrate. Therefore, the chip scale package structure disclosed by the present invention can provide unexpected effect than prior art, and solve the problems of prior art. The structure may apply to wafer or panel industry and also can be applied and modified to other related applications.

As will be understood by a person skilled in the art, the foregoing preferred embodiments of the present invention are illustrative of the present invention, rather than limiting the present invention. Having described the invention in connection with a preferred embodiment modification will suggest itself to those skilled in the art. Thus, the invention is not to be limited by this embodiment. Rather, the invention is intended to cover various modifications and similar arrangements included within the spirit and scope of the appended claims, the scope of which should be accorded the broadest interpretation so as to encompass all such modifications and similar structures.

Having described the invention, the following is claimed:

1. A structure of semiconductor device package, comprising:

multiple dice having a back surface and an active surface;

a seed metal layer directly formed on said back surface of said dice;

an adhesive layer directly formed on said seed metal layer;

a protection substrate formed on said adhesive layer and made of BT, FR5, PI, FR4 or PCB, whereby a back side protective scheme is formed by said seed metal layer, said adhesive layer and said protection substrate for preventing said structure of semiconductor device package from cracking or warping while a force is exerted on said protection substrate; and a plurality of bumps formed on said active surface of said dice for electrical connection.

2. The structure in claim 1, wherein the material of said adhesive layer includes elastic type material.

3. The structure in claim 1, wherein the material of said protection substrate includes build in fiber glass formed therein.

4. The structure in claim 1, wherein the size of said protection substrate is the same as the size of said dice.

5. The structure in claim 1, further comprising laser or ink marks formed on the top surface of said protection substrate.

6. The structure in claim 1, further comprising a redistribution layer (RDL) formed on said active surface of said dice.

7. A method for forming a semiconductor device package, comprising:

providing a wafer with a plurality of dice, wherein said dice have a back surface and an active surface;

forming a seed metal layer directly on said back surface of said dice;

forming an adhesive layer directly on said seed metal layer;

forming a protection substrate made of BT, FR5, PI, FR4, or PCB on said adhesive layer;

forming a plurality of bumps on said active surface of said dice; and singulating said plurality of dice into individual die by a dicing process.

8. The method in claim 7, wherein said step of forming the protection substrate is performed by a panel bonding method.

9. The method in claim 7, wherein said step of singulating said plurality of dice is performed by a sawing blade.

10. The method in claim 7, further comprising a step of forming laser or ink marks on a top surface of said protection substrate.

* * * * *